United States Patent
Chen et al.

(10) Patent No.: US 8,077,522 B2
(45) Date of Patent: Dec. 13, 2011

(54) MEMORY AND METHOD OPERATING THE MEMORY

(75) Inventors: Chung Kuang Chen, Pan Chiao (TW); Chun-Hsiung Hung, Hsinchu (TW); Yi-Te Shih, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 157 days.

(21) Appl. No.: 12/420,678

(22) Filed: Apr. 8, 2009

(65) Prior Publication Data

US 2009/0196104 A1  Aug. 6, 2009

Related U.S. Application Data

(63) Continuation of application No. 11/889,689, filed on Aug. 15, 2007, now Pat. No. 7,535,742.

(30) Foreign Application Priority Data

Sep. 14, 2007  (TW) ............................ 96134582 A

(51) Int. Cl.
*G11C 11/34* (2006.01)

(52) U.S. Cl. .................. 365/185.21; 365/185.18; 365/53
(58) Field of Classification Search ............ 365/185.21, 365/185.18, 53, 20, 207, 185.33, 208, 185.03, 365/185.17, 189.09, 185.05, 185.14, 185.11
See application file for complete search history.

(56) References Cited

U.S. PATENT DOCUMENTS

| 5,018,105 | A  | * | 5/1991  | Miyanishi ................... 365/203 |
| 7,130,236 | B2 |   | 10/2006 | Rajwani et al. |
| 7,433,230 | B2 | * | 10/2008 | Kono et al. ............. 365/185.11 |
| 2002/0075731 | A1 | * | 6/2002 | Amano ..................... 365/196 |
| 2003/0026145 | A1 |   | 2/2003  | Lee |

* cited by examiner

*Primary Examiner* — Dang Nguyen
(74) *Attorney, Agent, or Firm* — Bacon & Thomas, PLLC

(57) ABSTRACT

A memory comprises a memory array, a sense unit, and a biasing and shielding circuit. The biasing and shielding circuit is coupled to the memory array and the sense unit, wherein the biasing and shielding circuit comprises a first transistor, a second transistor, and a capacitor. The first transistor has a gate coupled to a biasing voltage and a first terminal coupled to the sense unit. The second transistor has a gate coupled to the biasing voltage and a first terminal coupled to a first potential. The capacitor is coupled to the sense unit and the first transistor.

7 Claims, 6 Drawing Sheets

MEMORY AND METHOD OPERATING THE MEMORY

This application is a continuation application of co-pending U.S. application Ser. No. 11/889,689, filed Aug. 15, 2007.

BACKGROUND OF THE INVENTION

1. Field of the Invention

The invention relates in general to a biasing and shielding circuit, and more particularly to a shielding circuit applied in a source-side sensing memory.

2. Description of the Related Art

Along with increasing development of technology, non-volatile memory, such as flash memory, has been wildly used in electronic product. For the reading operation of memory data of a flash memory device, a sensing circuit is used to sense a cell current of a target cell for determining the memory data value stored in the target cell. Referring to FIG. 1, a circuit diagram of a cell matrix of a traditional flash memory device is shown. When a cell Ca is accessed, the cell current I1 of the cell Ca should be sensed so as to determine the data value stored in the cell Ca. When sensing, a sense circuit 100 is coupled to the cell Ca. Due to that cell current I1 is hard to be sensed and shielded, a sense current I2 flowing to the sense circuit 100 is sensed instead and the sense current I2 is used to know the magnitude of the cell current I1 of the cell Ca for the operation of sensing. The cell current I1 and the sense current I2 satisfied an equation:

$$I1=I2+I3$$

I3 is a leak current bypassing through the cell Cb, which is adjacent to the cell Ca. The leak current I3 will affect the preciseness of the sense current I1 and the correctness of the data value sensed by the sense circuit 100. The less difference of cell current and sensing current is, the more precisely the sense circuit 100 performs. We define the difference of cell current and sensing current to be error current. Therefore, how to design a flash memory circuit having small error current and precise data value sensing result has become an important goal to achieve.

SUMMARY OF THE INVENTION

The invention is directed to a biasing and shielding circuit, which biases the voltage level of the sources of a target cell and an adjacent cell substantially to the same voltage level. The biasing and shielding circuit can effectively prevent the cell current of the target cell from the influence of the source current of the transistor of the adjacent cell, thus enhance the preciseness of the data value sensing result, and enhance the sensing speed of the sense unit.

According to a first aspect of the present invention, a memory comprising a memory array, a sense unit, and a biasing and shielding circuit is provided. The biasing and shielding circuit is coupled to the memory array and the sense unit, wherein the biasing and shielding circuit comprises a first transistor, a second transistor, and a capacitor. The first transistor has a gate coupled to a biasing voltage and a first terminal coupled to the sense unit. The second transistor has a gate coupled to the biasing voltage and a first terminal coupled to a first potential. The capacitor is coupled to the sense unit and the first transistor.

According to a second aspect of the present invention, a memory comprising a memory array, a sense unit, and a biasing and shielding circuit is provided. The biasing and shielding circuit is coupled to the memory array and the sense unit, wherein the biasing and shielding circuit comprises a first transistor, a second transistor, and a capacitor. The first transistor has a gate receiving a control signal, a first terminal coupled to a first potential. The second transistor has a gate receiving the control signal, a first terminal coupled to the first potential, a second terminal coupled to the sense unit. The capacitor is coupled to the sense unit and the first transistor.

According to a third aspect of the present invention, a method for operation memory, which comprises a target cell, an adjacent cell neighboring the target cell, and a sense unit coupled to the target cell and the adjacent cell, is provided and comprises the following steps. Firstly, a first voltage is applied to a first terminal of the target cell. Next, a second voltage is applied to a second terminal of the target cell. Then, the first voltage is applied to a first terminal of the adjacent cell. After that, a target cell current and an adjacent cell current are received at a sense node couple to the sense unit.

The invention will become apparent from the following detailed description of the preferred but non-limiting embodiments. The following description is made with reference to the accompanying drawings.

DETAILED DESCRIPTION OF THE INVENTION

The biasing and shielding circuit of this embodiment biases the source of a target cell and an adjacent cell to a biasing voltage level around the ground level, so as to prevent the sense current of the target cell from the influence of the source current of the adjacent cell next to the target cell.

Figure 1:
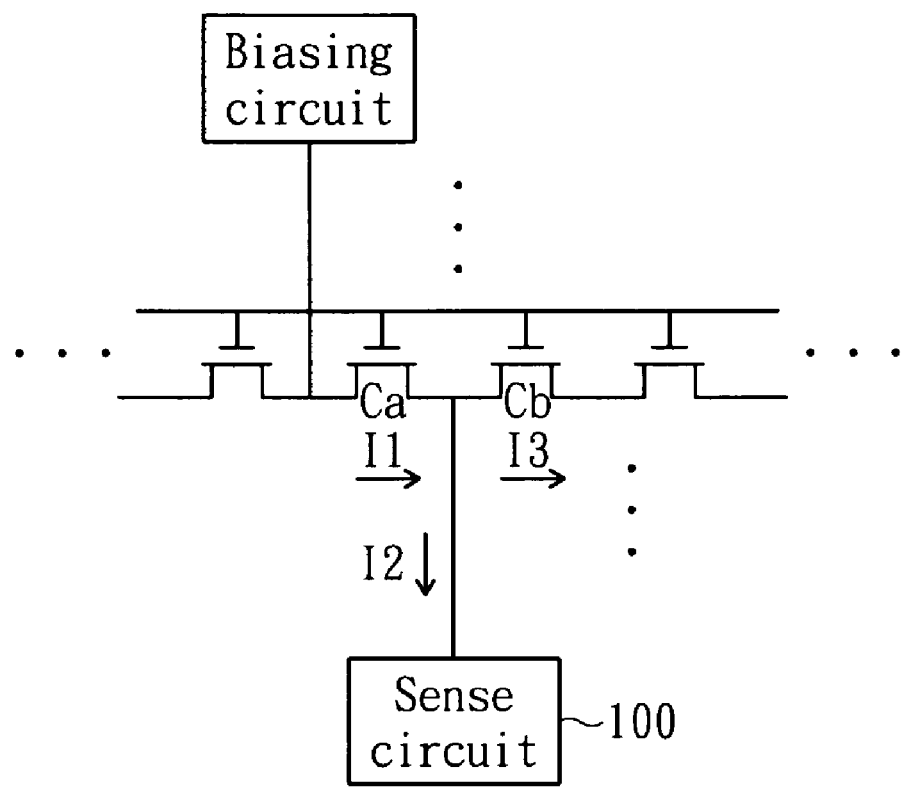
FIG. 1 is a circuit diagram of a cell matrix of a flash memory device.
Figure 2:
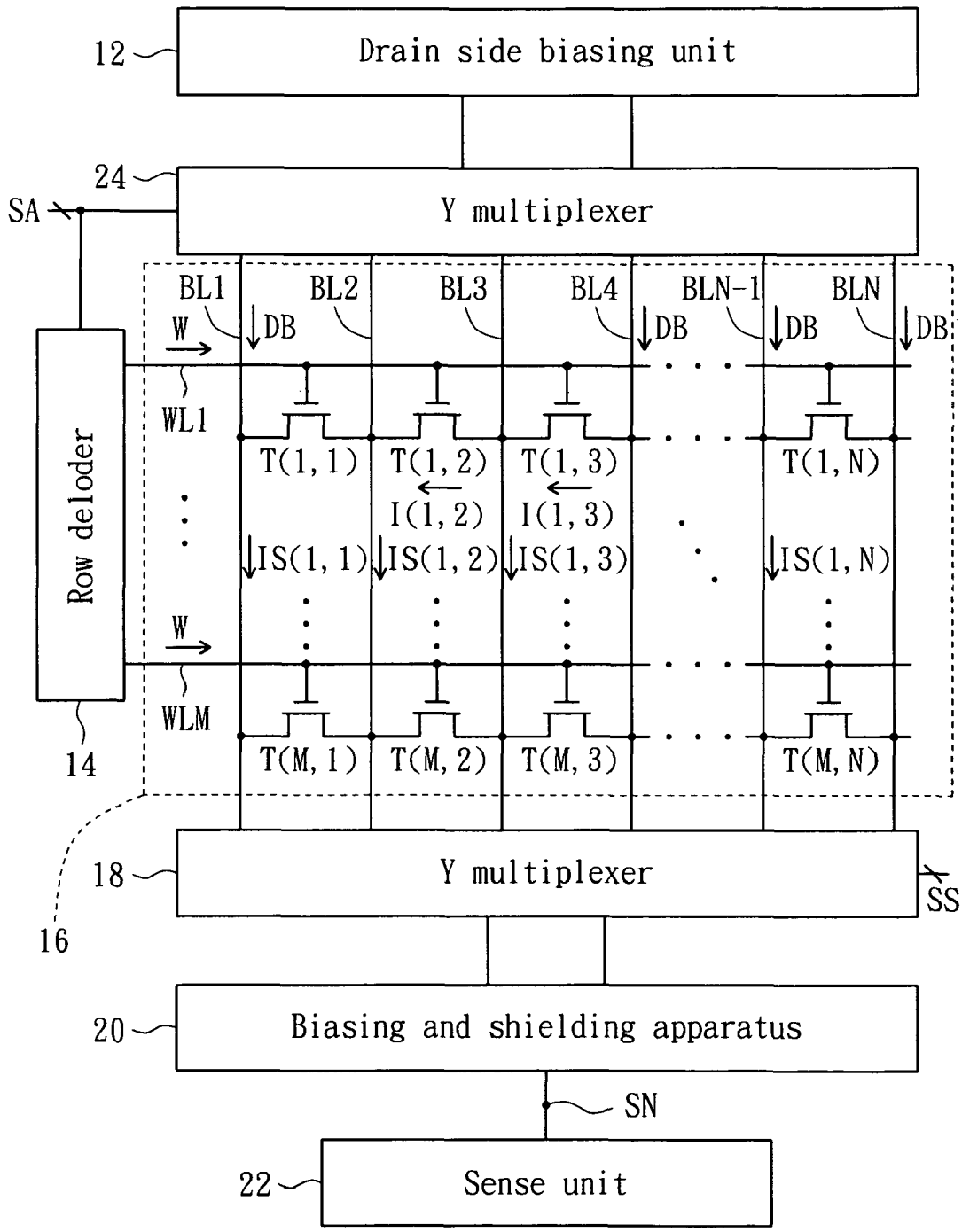
FIG. 2 is a block diagram of a flash memory 10 according to a preferable embodiment of the invention.

Referring to FIG. 2, a block diagram of a flash memory 10 according to a preferable embodiment of the invention is shown. The flash memory 10 is a source-side sensing memory including a drain side bias circuit 12, a row decoder 14, a memory cell array 16, a shielding circuit 20 and a sense unit 22. The memory cell array 16 includes numerous memory cells arranged in an M×N matrix, and each of the memory cells includes a transistor. For example, a transistor T(i,j) is included in a target cell, wherein i is an integer not larger than M, j is an integer not larger than N, and M and N are nature numbers.

The drain side bias circuit 12 is coupled to N bit lines BL1~BLN arranged along columns in the memory cell array 16 by a Y multiplexer 24 for providing drain bias signals DB to the drain side of the target cell or adjacent bit lines near by the drain side of the target cell in response to the address signals. The row decoder 14 is coupled to M word lines WL1~WLM arranged along rows in the memory cell array 16 for providing word signals W to the cells of M rows according to the address signals. The transistor T(i,j) of a target cell is turned on and a source current I(i,j) is generated in response to the corresponding drain bias signal DB and the corresponding word signal W. The sense unit 22 determines the memory data value of the target cell according to a sense current IS(i,j) outputted by the corresponding bit line coupled to the source of the transistor T(i,j) of the target cell. The sense current IS(i,j) is substantially close to the source current I(i,j). For example, the source current I(1,3) flowing through transistor T(1,3) in response to the drain bias signal DB and word signal W delivered by the bit line BL4 and the word line WL1 respectively, and the sense current IS(1,3) corresponding to source current I(1, 3) is outputted by the bit line BL3.

Figure 3:
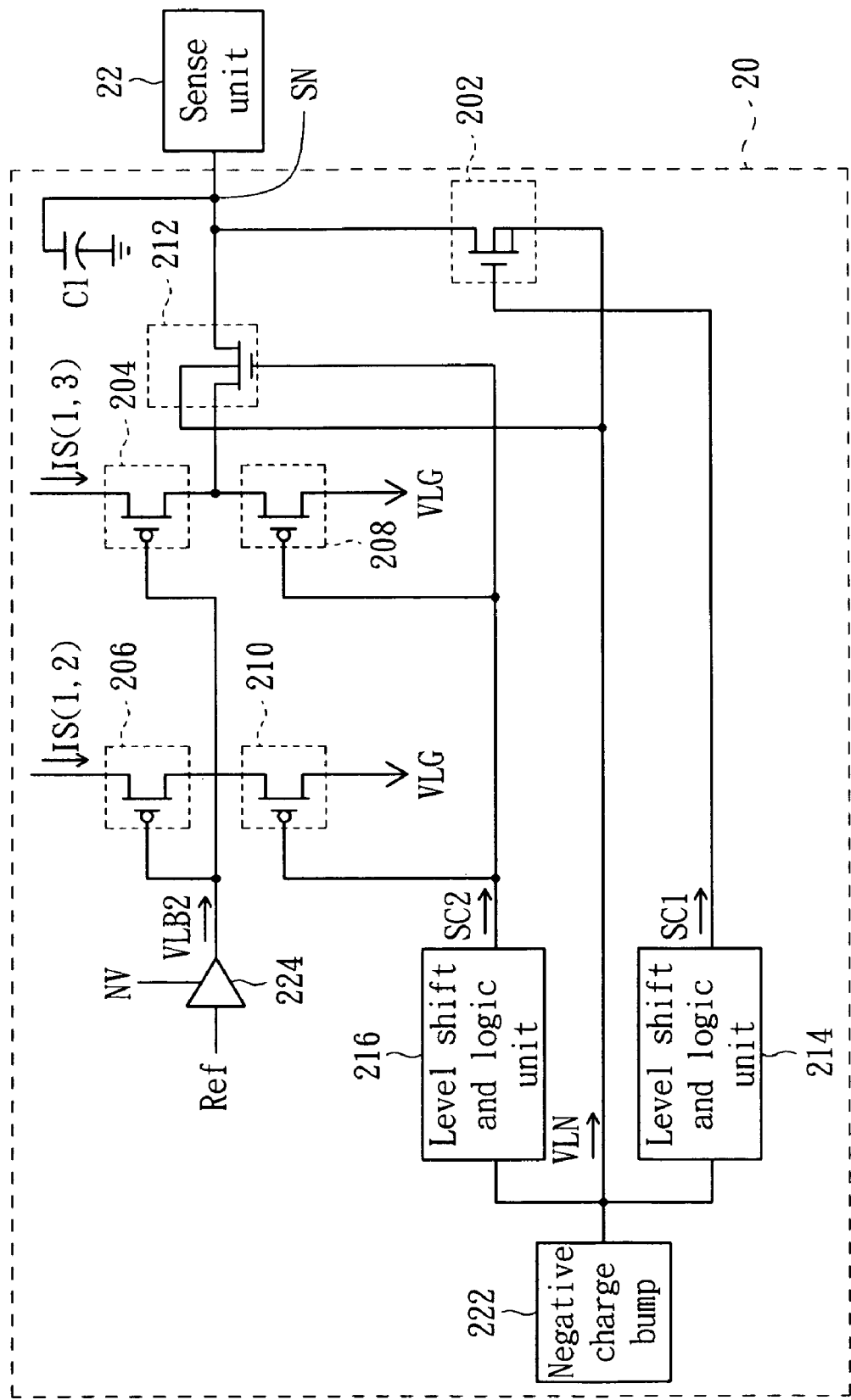
FIG. 3 is a first detail circuit diagram of the biasing and shielding circuit 20 in the FIG. 2.
Figure 4:
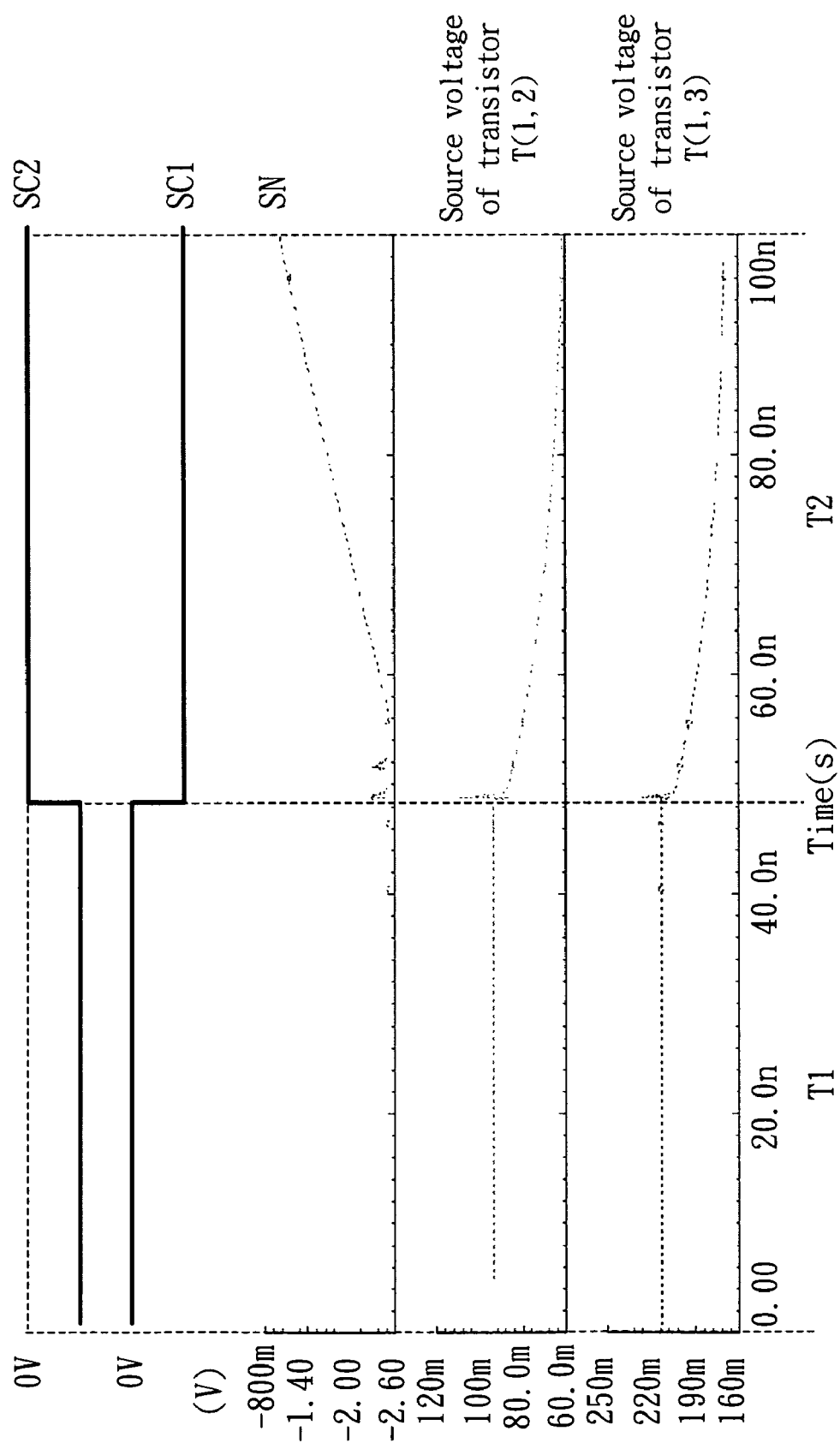
FIG. 4 is a signal waveform diagram of the shielding circuit 20 illustrated in FIG. 3.

The shielding circuit 20 prevents the sense current IS(i,j) from the influence of the source current I(i,j−1) of the transistor T(i,j−1) of the adjacent cell, and provides the sense current IS(i,j) to the sense unit 20. Next, the operation of the shielding circuit 20 is described by taking the memory cell including transistor T(1,3) for example Referring to FIG. 3, a first detail circuit diagram of the shielding circuit 20 in the FIG. 2 is shown, and referring to FIG. 4, a signal waveform diagram of the shielding circuit 20 in FIG. 3 is shown. The sense unit 22 is, for example, a voltage detector. The voltage detector determines whether the voltage level at a sense node SN is high or low in comparison with a reference voltage level, so as to determine the memory data value of the target cell.

The shielding circuit 20 includes a pre-discharge device, two biasing units, two voltage pull-down units and a connection unit. The pre-discharge device is coupled to the sense node SN for controlling the voltage level of the sense node SN. The pre-discharge device includes, for example, a transistor 202. The transistor 202 is an N type metal oxide semiconductor (MOS) transistor having a gate receiving the control signal SC1, a drain coupled to the sense node SN, and a source receiving the negative voltage level VLN. The transistor 202 is turned on and for pre-discharging the voltage level of the sense node SN to the negative voltage level VLN when the control signal SC1 is enabled in the first time period TP1 and is turned off when the control signal SC1 in disabled in a second time period TP2.

The two biasing units are coupled to the sources of the transistors T(1,3) and T(1,2) and is for biasing the voltage level of the sources of the transistors T(1,3) and T(1,2) substantially close to a biasing voltage level, respectively. The two biasing units include, for example, transistors 204 and 206 respectively. The transistors 204 and 206 are P type MOS transistors having gates receive the biasing voltage level VLB2, sources coupled to the sources of the transistors T(1,3) and T(1,2) respectively, and drains coupled to the respective two voltage pull-down units. The transistors 204 and 206 are turned on in response to the biasing voltage level VLB2, so as to make the voltage level of the sources of the transistors 204 and 206 substantially satisfied the equations:

$$Ve\_204 = VLB2 + Vth\_204$$

$$Ve\_206 = VLB2 + Vth\_206$$

Ve_204 and Ve_206 are the voltage level of the sources of the transistors 204 and 206 and Vth_204 and Vth_206 are the threshold voltage of the transistors 204 and 206. The threshold voltage Vth_204 and Vth_206 are substantially the same. As a result, the voltage level of the sources of the transistors T(1,3) and T(1,2), are substantially the same. The biasing voltage level VLB2 is, for example, a negative voltage level, and the voltage level of the sources of the transistors 204 and 206 are both close to the ground level VLG. The sense currents IS(1,3) and IS(1,2) are passed through the transistors 204 and 206, respectively.

The two voltage pull-down units are coupled to the respective drains of the transistors 204 and 206 and for pulling down the respective voltage level of the drains of the transistors 204 and 206. The two voltage pull-down units include, for example, transistors 208 and 210, respectively. The transistors 208 and 210 are P type MOS transistors having gates receive a control signal SC2, drains receive the ground level VLG, and sources coupled to the drains of the transistors 204 and 206, respectively.

The transistors 208 and 210 are respectively turned on and for pulling down the voltage level of the drains of the transistors 204 and 206 substantially close to the ground level VLG when the control signal SC2 is enabled and negative in the first time period TP1. Therefore, voltage level of the source of the transistors 204 and 206 are substantially close to the ground level VLG and the voltage level of the source of the transistors T(1,3) and T(1,2) are also substantially close to the ground level VLG in the first time period TP1. The control signal SC2 is, for example, an inverse signal of the control signal SC1.

The connection unit is coupled to the drain of the transistor 204 and the sense node SN for passing the sense current IS(1,3) flowing from the transistor 204 to charge the capacitor C1. The connection unit includes, for example, a transistor 212. The transistor 212 is an N type MOS transistor having a gate receiving the control signal SC2, a source coupled to the sense node SN, and a drain coupled to the drain of the transistor 204. The transistor 216 is turned on so as to connect the drain of the transistor 204 to the sense node SN in the time period TP2. Therefore, the sense current IS(1,3) is passed to charge the capacitor C1, the voltage of the sense node SN varies with the sense current IS(1,3) multiplies with time and the data value of the target memory cell can be determined by the sense unit 22.

The cross voltage over the drain and source of the transistor T(1,2) is small because the voltage level of the sources of the transistors 206 and 204 are substantially close to each other. For example, the voltage level of the sources of the transistors 206 and 204 are 93 millivolt (mV) and 214 mV, respectively. Conventional the voltage level of the sources of the transistors 206 and 204 are 0 mill volt (mV) and 214 mV. The source current I(1,2), i.e. the leak current of source current (1, 3) is small due to the small cross voltage between source and drain of the transistor T(1,2). As a result, the biasing and shielding circuit 20 can effectively decrease the amount of the leak current to make the source current I(1,3) and the sense current IS(1,3) close to each other and the correctness rate of data value sensed by the sense circuit 22 is raised.

The transistor 204 is biased in saturation region in the second time period TP2 because the source-drain voltage of transistor 204, which is close to 2.6 V(0−(−2.6)), is larger than the voltage difference between the gate-source voltage and the threshold voltage of the transistor 204. By using the transistor 204 operating in saturation region, the equivalent capacitance looking into the sense node SN is much smaller than the equivalent capacitance looking into the sense node in the traditional source side sensing memory. Therefore, the changing speed of the voltage at the sense node SN is enhanced, and the operational speed of sensing is effectively increased.

The biasing and shielding circuit 20 further includes a negative charge pump 222, level shift and logic units 214 and 216. The negative charge pump 222 provides the negative voltage level VLN to the pre-discharge unit having the transistor 202 for setting the voltage level of the sense node SN to the negative voltage level VLN, which is substantially equal to −2.6 V. The level shift and logic units 214 and 216 provide the control signal SC1 and SC2 according to the negative voltage level VLN, respectively. The high and low level of the control signal SC1 and SC2 are substantially equal to the ground level VLG and VLN. The biasing and shielding circuit 20 further includes a regulator 224, which generates the biasing voltage level VLB2 in response to a reference signal Ref and a source signal NV. The source signal NV is, for example, provided by the negative charge pump 222 and has the negative voltage level VLN.

Referring to FIG. 2, the flash memory 10 according to the embodiment further includes a Y-multiplexer 18 coupled to the bit lines BL1~BLN for receiving the sense currents of the corresponding N columns of memory cells. The Y-multiplexer 18 connects the corresponding bit lines BL3 and BL2 to the sources of the transistors 204 and 206 in response to selection signal bus SS. The selection signal is relevant to the address signal SA. For example, when the drain side biasing unit 12 and the row decoder 14 provide the corresponding drain bias signal DB and the word signal W to drive the transistor T(1,3), the y-multiplexer 18 couples the bit line BL3 and BL2 to the sources of the transistors 204 and 206, respectively. Therefore, the biasing and shielding circuit 20 is capable of biasing the voltage level of the sources of the transistors T(1,3) and T(1,2) close to the ground level VLG and transfer the sense current IS(1,3) to voltage passed to the sense unit 22 through the Y-multiplexer 18.

Although the operation of the Y-multiplexer 18 is exemplified to respectively connect the bit lines BL3 and BL2 to the source of the transistors 204 and 206, the Y-multiplexer 18 can further connect other bit lines to the source of the transistors 204 and 206 in response to the different selection signal bus SS'. Therefore, the sense unit 22 can sense the sense current corresponding to the source current of the cell on other columns of cells and the biasing and shielding circuit 20 can prevent the sense current corresponding to the target cell from the influence of the source current of the transistor of the adjacent cell. Although the operation of the biasing and shielding circuit 20 is exemplified to prevent the sense current IS(1,3) of the target cell from the influence of the source current I(1,2), the operation of preventing other sense current from the influence of the corresponding source current is similar to the operation described above.

Figure 5:
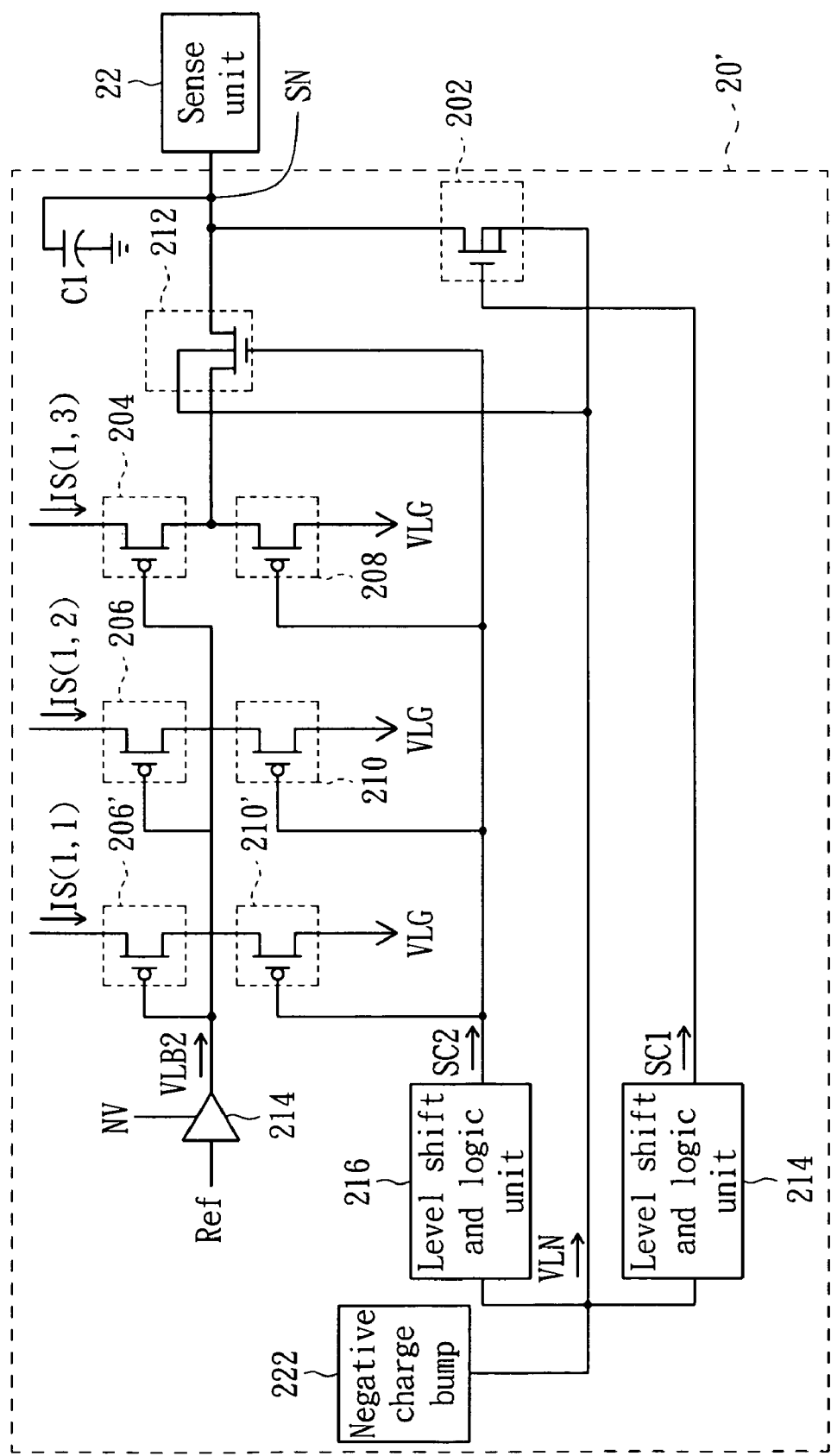
FIG. 5 is a second detail circuit diagram of the biasing and shielding circuit 20 in the FIG. 2.

In the biasing and shielding circuit 20 of the embodiment, the biasing unit having the transistor 206 and the voltage pull-down unit having the transistor 210 form a shielding device for preventing the sense current of the target cell from the influence of the source current of the adjacent cell. Although the biasing and shielding circuit 20 of the embodiment is exemplified to have only one shielding device, the biasing and shielding circuit 20 of the embodiment is not limited to include only one shielding unit. For example, referred to FIG. 5, a second detailed circuit diagram of the biasing and shielding circuit 20 in the FIG. 2 is shown. In the biasing and biasing and shielding circuit 20' shown in FIG. 5, another shielding device including a biasing unit, which includes a transistor 206', and a voltage pull-down unit, which includes a transistor 210', are added to the circuit of biasing and biasing and shielding circuit 20 mentioned above. The biasing unit having the transistor 206' and the voltage pull-down unit having the transistor 210' biases and pulls down the voltage level of the source of the transistor T(1,1). Therefore, the biasing and biasing and shielding circuit 20' can further bias the voltage level of the source of the transistor T(1,1) for reducing the source current I(1,1) of the transistor T(1,1). The biasing and biasing and shielding circuit 20' can also effectively prevent the sense current IS(1,3) from the influence of the source currents I(1,2) and I(1,3) and enhance the preciseness of the sense current IS(1,3).

Figure 6:
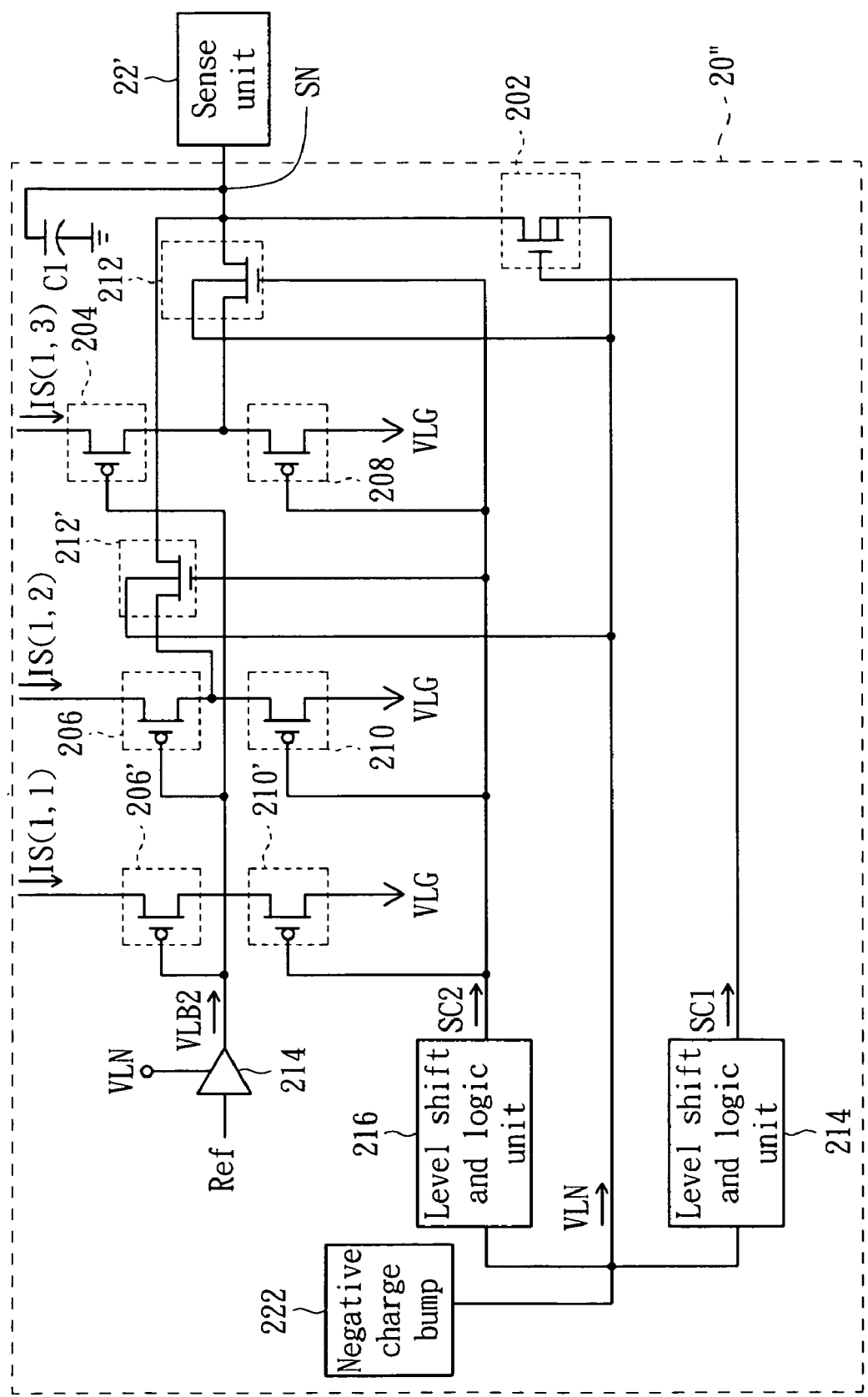
FIG. 6 is a third detail circuit diagram of the biasing and shielding circuit 20 in the FIG. 2.

In the biasing and shielding circuit 20, the transistors 204, 208, 212, and capacitor C1 form a sense device for providing the sense current of the target cell to the sense unit 22. Although the biasing and shielding circuit 20 of the embodiment is exemplified to have only one sense device, the biasing and shielding circuit 20 of the embodiment is not limited to include only one sense device. For example, referred to FIG. 6, a third detail circuit diagram of the biasing and shielding circuit 20 in the FIG. 2 is shown. In the biasing and shielding circuit 20" shown in FIG. 6, another connection unit, which includes a transistor 212', is added to the circuit of biasing and shielding circuit 20' mention above. The biasing unit having the transistor 206, the voltage pull-down unit having the transistor 210, and the connection unit having the transistor 212' form another sense device provides both the sense current IS(1,2) and IS(1,3) to charge the sense node SN. Therefore, the biasing and shielding circuit 20" can further provide the sense current IS(1,2), which is a component of the source current I(1,3) bypassing through the transistor T(1,2), to charge the sense node SN. The sense node SN is charged by the sum of the sense current IS(1,3) and IS(1,2) and the sense current sensed by the sense unit 22' is much closer to the source current I(1,3) than the sense current sensed by the sense unit 22 in FIG. 3 and FIG. 5. Consequently, the biasing and shielding circuit 20" can effectively improve the preciseness of the sense current sensed by the sense unit 22'.

The biasing and shielding circuits 20, 20' and 20" respectively having one sense and one shielding devices, one sense and two shielding units, and two sense and one shielding units, have been cited above. However, the number of sense and shielding devices included in the biasing and shielding circuit of the embodiment is not limited thereto.

The biasing and shielding circuit of this embodiment biases the sources of the transistors in a target cell and an adjacent cell to a biasing voltage level around the ground level. Therefore, the sense current of the target cell is effectively prevented from the influence of the source current of an adjacent cell and the preciseness of the data value sensing result of a traditional source side sensing flash memory device is effectively improved.

The biasing and shield circuit of the embodiment uses a transistor 204, which biased in the saturation region when the sense current IS(1,3) is provided to the sense node SN. Therefore, the equivalent capacitance looking into the sense node SN is much smaller than the equivalent capacitance looking into the sense node in the traditional source side sensing flash memory and the changing speed of the voltage at the sense node SN and the operational speed of sensing are effectively increased.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A memory comprising:
   a memory array, comprising a target cell, which provides a sense current, and a first adjacent cell, which provides a source current;
   a sense unit; and
   a biasing and shielding circuit, coupled to the memory array and the sense unit, wherein the biasing and shielding circuit comprises:

a first transistor having a gate coupled to a biasing voltage, a first terminal coupled to the sense unit;

a second transistor having a gate coupled to the biasing voltage, a first terminal coupled to a first potential; and a capacitor coupled to the sense unit and the first transistor, wherein, the sense unit senses a sense voltage, which is hold by the capacitor, on a sense node and the biasing and shielding circuit prevents the sense current from the influence of the source current, wherein:

the first transistor further comprises a second terminal coupled to a source of the target cell, the first transistor is turned on based on the bias voltage so as to bias the source of the target cell to a second bias voltage, and the first transistor further provides the sense current to charge the capacitor so as to establish the sense voltage on the sense node; and a second transistor further comprises a second terminal coupled to a source of the first adjacent cell and the second transistor is turned on based on the bias voltage so as to bias the source of the target cell to the second bias voltage.

2. The memory according to claim 1, wherein the biasing and shielding circuit further comprises:

a sixth transistor, comprising a gate receiving a second control signal, a first terminal coupled to a second terminal of the first transistor, and a second terminal coupled to the sense node.

3. The memory according to claim 2, further comprising:

a negative charge pump for providing a negative voltage; and a second level shift and logic unit for providing the second control signal according to the negative voltage level, wherein the second control signal is high and low in a second time period and a first time period respectively.

4. The memory according to claim 1, wherein the biasing and shielding circuit further comprises:

a third transistor, comprising a gate receiving a first control signal, a first terminal coupled to the sense node, and a second terminal receiving a negative voltage.

5. The memory according to claim 4, wherein the biasing and shielding circuit further comprises:

a negative charge pump for providing the negative voltage to the third transistor; and a first level shift and logic unit for providing the first control signal according to the negative voltage level, wherein the first control signal is high and low in a first time period and a second time period respectively.

6. The memory according to claim 1, wherein the biasing and shielding circuit further comprises:

a fourth transistor, comprising a gate receiving a second control signal, a first terminal coupled to a second terminal of the first transistor, and a second terminal receiving a ground voltage; and a fifth transistor, comprising a gate receiving the second control signal, a first terminal coupled to a second terminal of the second transistor, and a second terminal receiving the ground voltage.

7. The memory according to claim 6, further comprising:

a negative charge pump for providing a negative voltage; and a second level shift and logic unit for providing the second control signal according to the negative voltage level, wherein the second control signal is high and low in a second period and a first time period respectively.

* * * * *